US011664247B2

(12) United States Patent
Patil

(10) Patent No.: US 11,664,247 B2
(45) Date of Patent: May 30, 2023

(54) DYNAMIC INTERFACE FOR PROVIDING A SYMMETRIC RADIO FREQUENCY RETURN PATH

(71) Applicant: Applied Materials, Inc., Santa Clara, CA (US)

(72) Inventor: Ravikumar Patil, Karnataka (IN)

(73) Assignee: Applied Materials, Inc., Santa Clara, CA (US)

( * ) Notice: Subject to any disclaimer, the term of this patent is extended or adjusted under 35 U.S.C. 154(b) by 215 days.

(21) Appl. No.: 17/072,750

(22) Filed: Oct. 16, 2020

(65) Prior Publication Data
US 2022/0122857 A1 Apr. 21, 2022

(51) Int. Cl.
*H01L 21/677* (2006.01)
*H01L 21/67* (2006.01)
(Continued)

(52) U.S. Cl.
CPC .. *H01L 21/67115* (2013.01); *H01J 37/32082* (2013.01); *H01L 21/67346* (2013.01); *H01L 21/68785* (2013.01)

(58) Field of Classification Search
CPC ......... H01L 21/67011; H01L 21/67155; H01L 21/67383; H01L 21/67742; H01L 21/67751
See application file for complete search history.

(56) References Cited

U.S. PATENT DOCUMENTS

2007/0012558 A1\* 1/2007 White ................... C23C 14/35
204/192.1
2009/0178617 A1 7/2009 White et al.
(Continued)

FOREIGN PATENT DOCUMENTS

CN 101205605 B 1/2012
JP 2008-502135 A 1/2008
(Continued)

OTHER PUBLICATIONS

International Search Report and Written Opinion dated Feb. 3, 2022 in International Patent Application No. PCT/US2021/054793, 7 pages.

*Primary Examiner* — Jae Lee
(74) *Attorney, Agent, or Firm* — Kilpatrick Townsend & Stockton LLP

(57) ABSTRACT

Exemplary substrate processing system may include a chamber body that defines a processing region. The systems may include a liner positioned atop the chamber body. The liner may include first disconnect members. The systems may include a faceplate that is positioned atop the liner. The systems may include a support disposed within the chamber body. The support may include a plate comprising a heater. The plate may include second disconnect members. The support may include a shaft coupled with the plate. The support may include a dynamic plate disposed about the shaft below the plate. The support may include metallic straps that couple the plate with the dynamic plate. The dynamic plate may include inner disconnect members and outer disconnect members. Inner disconnect members may be engageable with second disconnect members in a transfer position. Outer disconnect members may be engageable with first disconnect members in a process position.

17 Claims, 11 Drawing Sheets

(51) Int. Cl.
    *H01L 21/687*     (2006.01)
    *H01L 21/673*     (2006.01)
    *H01J 37/32*     (2006.01)

(56) References Cited

U.S. PATENT DOCUMENTS

2011/0104896 A1*   5/2011   Harada .................. C23C 16/56
                                                                                118/725
2019/0360100 A1   11/2019   Nguyen et al.

FOREIGN PATENT DOCUMENTS

| KR | 10-0789461 B1 | 1/2008 |
|----|---------------|--------|
| TW | 201740435 A | 11/2017 |
| TW | 202013426 A | 4/2020 |

* cited by examiner

DYNAMIC INTERFACE FOR PROVIDING A SYMMETRIC RADIO FREQUENCY RETURN PATH

TECHNICAL FIELD

The present technology relates to semiconductor processes and equipment. More specifically, the present technology relates to substrate processing systems and components.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Cluster tools often process a number of substrates by continuously passing substrates through a series of chambers and process operations. The process recipes and sequences will typically be programmed into a microprocessor controller that will direct, control, and monitor the processing of each substrate through the cluster tool. Once an entire cassette of wafers has been successfully processed through the cluster tool, the cassette may be passed to yet another cluster tool or stand-alone tool, such as a chemical mechanical polisher, for further processing.

Robots are typically used to transfer the wafers through the various processing and holding chambers. The amount of time required for each process and handling operation has a direct impact on the throughput of substrates per unit of time. Substrate throughput in a cluster tool may be directly related to the speed of the substrate handling robot positioned in a transfer chamber. As processing chamber configurations are further developed, conventional wafer transfer systems may be inadequate. Additionally, as cluster tools scale, component configurations may no longer adequately support processing or maintenance operations.

Thus, there is a need for improved systems and methods that can be used to efficiently direct substrates within cluster tool environments. These and other needs are addressed by the present technology.

SUMMARY

Exemplary substrate processing systems may include a chamber body that defines a processing region. The systems may include a liner positioned atop the chamber body. A bottom surface of the liner may include a first plurality of quick disconnect members. The systems may include a faceplate that is positioned atop the liner. The systems may include a substrate support disposed within the chamber body. The substrate support may include a support plate that includes a heater. A bottom surface of the support plate may include a second plurality of quick disconnect members. The substrate support may include a shaft that is coupled with a bottom of the support plate. The substrate support may include a dynamic plate disposed about the shaft and spaced a distance below the support plate. The substrate support may include a plurality of metallic straps that couple a bottom of the support plate with the dynamic plate. A top surface of the dynamic plate may include an inner plurality of quick disconnect members and an outer plurality of quick disconnect members. Each of the inner plurality of quick disconnect members may be engageable with a respective one of the second plurality of quick disconnect members when the substrate support is in a transfer position. Each of the outer plurality of quick disconnect members may be engageable with a respective one of the first plurality of quick disconnect members when the substrate support is in a process position.

In some embodiments, each of the outer plurality of quick disconnect members may be disengaged from the respective one of the first plurality of quick disconnect members when the substrate support is in the transfer position. Each of the inner plurality of quick disconnect members may be disengaged from the respective one of the second plurality of quick disconnect members when the substrate support is in the process position. The substrate support may be proximate the faceplate when in the process position. The substrate support may be proximate a base of the chamber body when in the transfer position. A peripheral edge of the dynamic plate may extend radially beyond a peripheral edge of the support plate. Each of the outer plurality of quick disconnect members may include a guide pin. Each of the first plurality of quick disconnect members may define a receptacle with a spring loaded catch that is sized to receive and secure a respective one of the guide pins. A top surface of each of the guide pins may be at a lower height than a top surface of the heater. The support plate may also include an isolator coupled with the heater and a ground plate coupled with a bottom of the isolator. The second plurality of quick disconnect members may be disposed on the ground plate. Each of the plurality of straps may be coated with a precursor-resistant material. The systems may include radio frequency source coupled with the substrate support. In the process position, a closed radio frequency circuit may be formed between the radio frequency source, the substrate support, the plurality of straps, the liner, and the faceplate.

Some embodiments of the present technology may also encompass substrate processing systems. The systems may include a chamber body that defines a processing region. The systems may include a liner positioned atop the chamber body. The systems may include a faceplate that is positioned atop the liner. The systems may include a substrate support disposed within the chamber body. The substrate support may include a support plate comprising a heater. The substrate support may include a shaft that is coupled with a bottom of the support plate. The substrate support may include a dynamic plate disposed about the shaft and spaced a distance below the support plate. The substrate support may include a plurality of metallic straps that couple a bottom of the support plate with the dynamic plate. The systems may include a plurality of quick disconnect members that couple the liner with the dynamic plate when the substrate support is in a process position and that couple the support plate with the dynamic plate when the substrate support is in a transfer position.

In some embodiments, the plurality of quick disconnect members may include an outer plurality of quick disconnect members on the dynamic plate that engage with a first plurality of disconnect members on the liner and an inner plurality of quick disconnect members on the dynamic plate that engage with a second plurality of disconnect members on the support plate. Each of the outer plurality of quick disconnect members may be disengaged from the respective one of the first plurality of quick disconnect members when the substrate support is in the transfer position. Each of the inner plurality of quick disconnect members may be disengaged from the respective one of the second plurality of quick disconnect members when the substrate support is in the process position. The plurality of quick disconnect members may include a first subset of quick disconnect members and a second subset of quick disconnect members. Each of the first subset of quick disconnect members may include a guide pin. Each of the second subset of quick disconnect members may define a receptacle with a spring loaded catch that is sized to receive and secure a respective one of the guide pins. A top surface of each of the guide pins may be at a lower height than a top surface of the heater. The support plate may include an isolator coupled with the heater and a ground plate coupled with a bottom of the isolator. At least some of the plurality of quick disconnect members may be disposed on the ground plate. The systems may include a radio frequency source coupled with the substrate support. In the process position, a closed radio frequency circuit may be formed between the radio frequency source, the substrate support, the plurality of straps, the liner, and the faceplate. The substrate support may be movable in a vertical direction between the transfer position and the process position.

Some embodiments of the present technology may also encompass methods of processing substrates. The methods may include moving a substrate support upward within a semiconductor processing chamber from a transfer position to a process position to disengage a first plurality of quick disconnect members and to engage a second plurality of quick disconnect members. When engaged, the first plurality of disconnect members may couple a support plate of the substrate support with a dynamic plate of the substrate support. When engaged, the second plurality of disconnect members may couple a liner of the semiconductor processing chamber with the dynamic plate. The support plate may include a heater. The methods may include delivering one or more precursors to the semiconductor processing chamber. The methods may include supplying a radio frequency current to the heater via a radio frequency source.

In some embodiments, the substrate support may include a plurality of metallic straps that couple a bottom of the support plate with the dynamic plate. In the process position, a closed radio frequency circuit may be formed between the radio frequency source, the substrate support, the plurality of straps, the liner, and the faceplate.

Such technology may provide numerous benefits over conventional systems and techniques. For example, the processing systems may provide multi-substrate processing capabilities that may be scaled well beyond conventional designs. Additionally, each chamber system may include a dynamic radio frequency circuit that closes when the heater is in a process position and that opens when the heater is in a transfer position. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
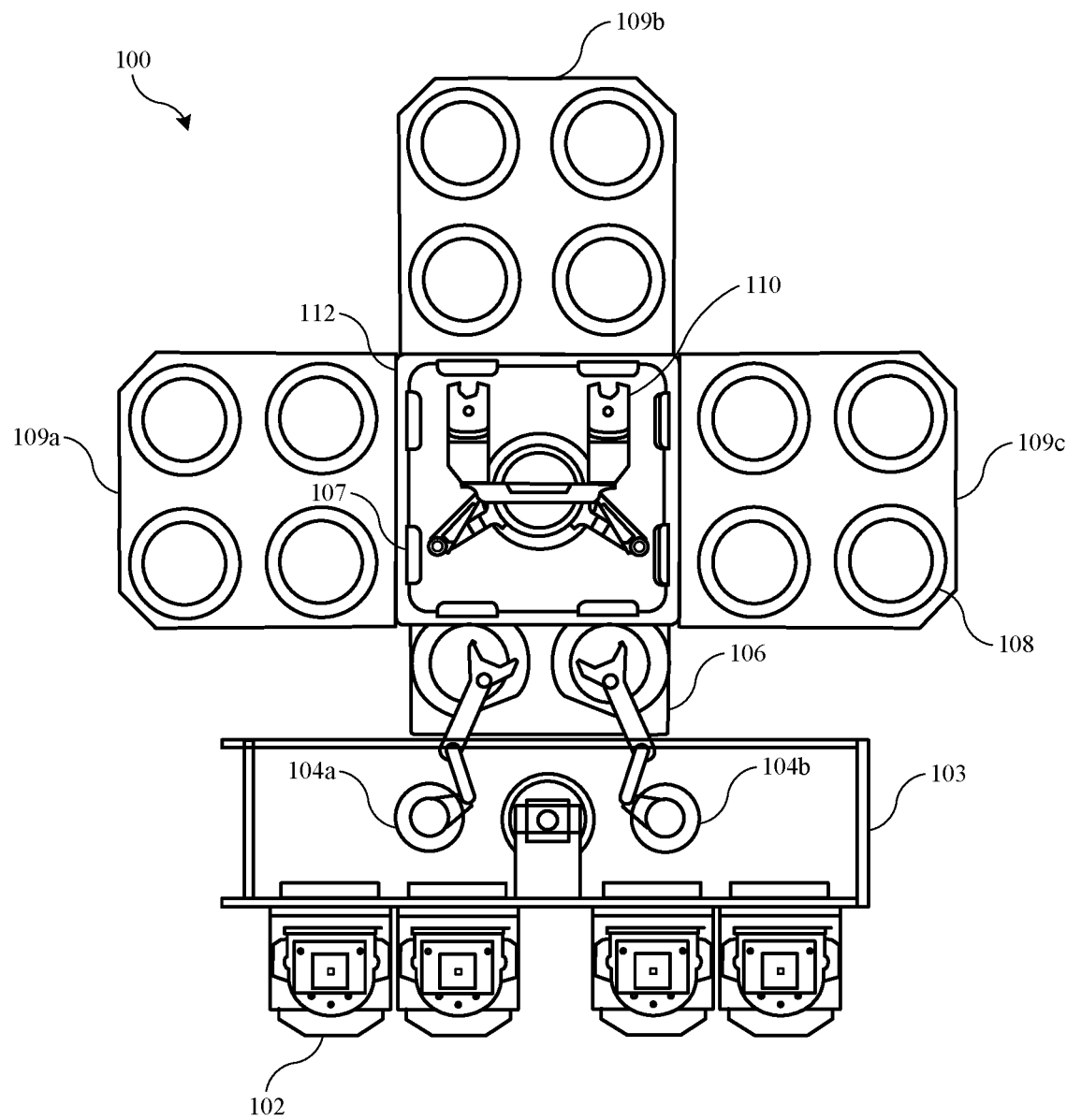
FIG. 1 shows a schematic top plan view of an exemplary processing system according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot.

For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

However, as additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. The present technology may not use conventional wafer carriers in some embodiments, and may transfer specific wafers from one substrate support to a different substrate support within the transfer region.

With shrinking nodes on the wafer, the variables that contribute to the on wafer performance increase. Variables contributing to on wafer radial uniformity may include the control of a radio frequency current for pedestal heaters and a design of supply/return path for radio frequency currents are some of variables. Isolation of a radio frequency supply and return in processing systems that include multiple chambers with a dedicated heater for each chamber is essential to avoid cross talk between chambers to individually control and improve the on wafer performance of each chamber, such as by independently tuning the plasma impedance by controlling radio frequency supply/return current of individual chamber. Additionally, by providing a symmetric radio frequency return path one can eliminate and/or minimize the radio frequency impact on the on wafer radial uniformity.

Conventional processing systems may achieve a symmetric radio frequency return path by arranging components in the radio frequency return path as concentric cylinders so that the radio frequency return current can be uniformly and symmetrically transferred back from the face plate to the radio frequency source. The radio frequency path may be made dynamic to enable the wafer transfer to and from a transfer apparatus. For example, a dynamic path may make the radio frequency circuit open and close based on the heater position. The radio frequency circuit may close when the heater is in a process position, which allows radio frequency return current to go back to the radio frequency source. The radio frequency circuit may remain open and radio frequency current will not flow when the heater is in a transfer position.

Some conventional processing systems utilize contact between a liner and a flexible baffle to open and close the radio frequency circuit. The baffle may be coupled with the heater such that when the heater is in the process position, the baffle is moved to an upward position and is in contact with a liner of the chamber. Contact between the liner and the baffle closes the radio frequency circuit by connecting the liner with the heater. When the heater is lowered to a transfer position, the baffle is lowered and brought out of contact with the liner, which opens the radio frequency circuit. While such baffle solutions generate a dynamic radio frequency path, the use of a baffle creates several problems. For example, due to relatively large surface area of the dynamic interface between the baffle and the liner, residual particles that remain on the liner plate from previous deposition operations may be released when the liner and baffle contact one another. While these particles may be downstream of the heater, the particles may still be deposited on the wafer, leading to diminished wafer performance. For example, many deposition operations may include a purge gas being supplied to the chamber from below the chamber. The flow of the purge gas may entrain the particles and deliver the particles onto the surface of the wafer.

Additional problems may arise due to the design of conventional bellows. For example, conventional bellows may by formed from stainless steel materials, which may react with various precursors, such as nitrogen trifluoride to form additional particles. Additionally, typical bellows are quite heavy, often weighing about 8 kg and being preassembled for installation in kits that weigh up to 18 kg. This makes installation and servicing difficult, often requiring multiple technicians.

To address these and other concerns, embodiments of the present technology may replace the baffle with a number of relatively small quick disconnect members that engage a dynamic plate with the liner to connect the heater with the liner. This connection provides a similar dynamic radio frequency circuit as provided by baffles while reducing the dynamic contact area that may contribute to particle generation. Additionally, the quick disconnect members may be considerably lighter than the bellows, which may make installation and service feasible for a single technician.

Although the remaining disclosure will routinely identify specific structures, such as four-position chamber systems, for which the present structures and methods may be employed, it will be readily understood that the systems and methods are equally applicable to any number of structures and devices that may benefit from the structural capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1 shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected.

Each substrate processing region 108 can be outfitted to perform a number of substrate processing operations including any number of deposition processes including cyclical layer deposition, atomic layer deposition, chemical vapor deposition, physical vapor deposition, as well as etch, pre-clean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 2:
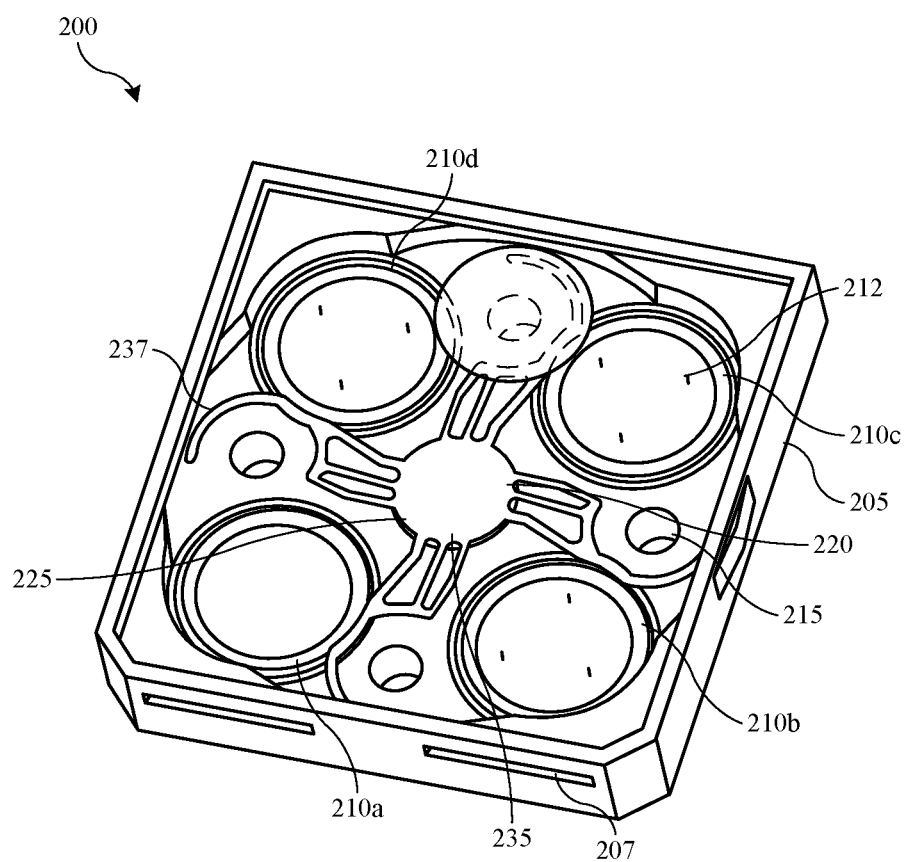
FIG. 2 shows a schematic isometric view of a transfer region of an exemplary chamber system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region described above, and may include any of the components or characteristics described. The system illustrated may include a transfer region housing 205, which may be a chamber body as discussed further below, defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology. The transfer apparatus 220 may include a number of components and configurations that may facilitate the movement of the end effector in multiple directions, which may facilitate rotational movement, as well as vertical movement, or lateral movement in one or more ways with the drive system components to which the end effector may be coupled.

Figure 3:
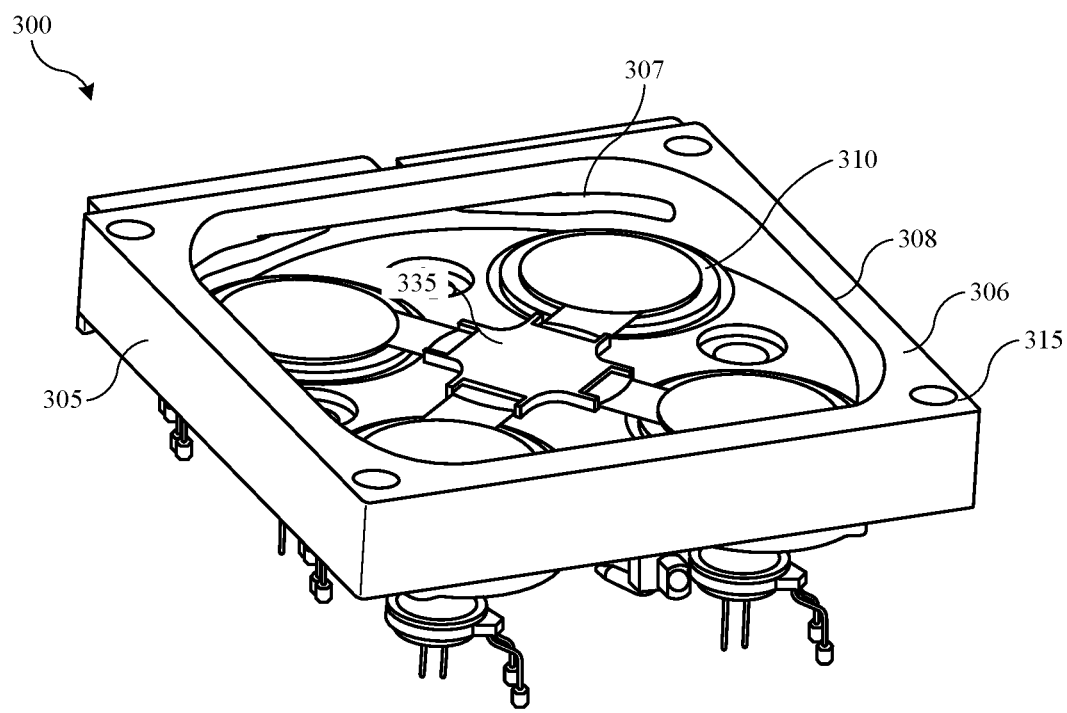
FIG. 3 shows a schematic isometric view of a transfer region of an exemplary chamber system according to some embodiments of the present technology.

FIG. 3 shows a schematic isometric view of a transfer region of a chamber system 300 of an exemplary chamber system according to some embodiments of the present technology. Chamber system 300 may be similar to the transfer region of chamber system 200 described above, and may include similar components including any of the components, characteristics, or configurations described above. FIG. 3 may also illustrate certain component couplings encompassed by the present technology along with the following figures.

Chamber system 300 may include a chamber body 305 or housing defining the transfer region. Within the defined volume may be a plurality of substrate supports 310 distributed about the chamber body as previously described. As will be described further below, each substrate support 310 may be vertically translatable along a central axis of the substrate support between a first position illustrated in the figure, and a second position where substrate processing may be performed. Chamber body 305 may also define one or more accesses 307 through the chamber body. A transfer apparatus 335 may be positioned within the transfer region and be configured to engage and rotate substrates among the substrate supports 310 within the transfer region as previously described. For example, transfer apparatus 335 may be rotatable about a central axis of the transfer apparatus to reposition substrates. The transfer apparatus 335 may also be laterally translatable in some embodiments to further facilitate repositioning substrates at each substrate support.

Chamber body 305 may include a top surface 306, which may provide support for overlying components of the system. Top surface 306 may define a gasket groove 308, which may provide seating for a gasket to provide hermetic sealing of overlying components for vacuum processing. Unlike some conventional systems, chamber system 300, and other chamber systems according to some embodiments of the present technology, may include an open transfer region within the processing chamber, and processing regions may be formed overlying the transfer region. Because of transfer apparatus 335 creating an area of sweep, supports or structure for separating processing regions may not be available. Consequently, the present technology may utilize overlying lid structures to form segregated processing regions overlying the open transfer region as will be described below. Hence, in some embodiments sealing between the chamber body and an overlying component may only occur about an outer chamber body wall defining the transfer region, and interior coupling may not be present in some embodiments. Chamber body 305 may also define apertures 315, which may facilitate exhaust flow from the processing regions of the overlying structures. Top surface 306 of chamber body 305 may also define one or more gasket grooves about the apertures 315 for sealing with an overlying component. Additionally, the apertures may provide locating features that may facilitate stacking of components in some embodiments.

Figure 4:
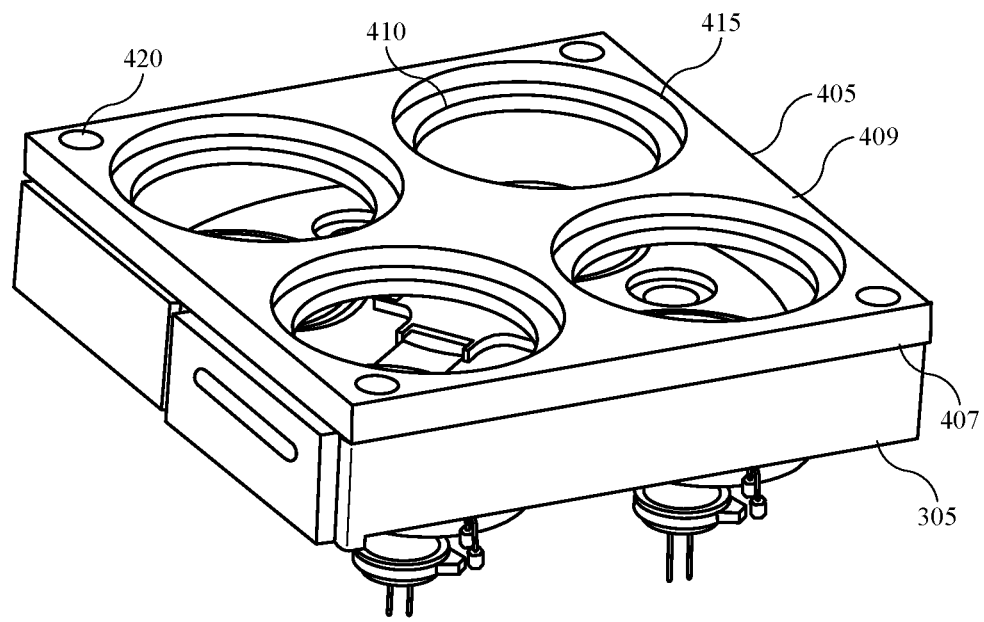
FIG. 4 shows a schematic isometric view of a transfer region of an exemplary chamber system according to some embodiments of the present technology.

FIG. 4 shows a schematic isometric view of overlying structures of chamber system 300 according to some embodiments of the present technology. For example, in some embodiments a first lid plate 405 may be seated on chamber body 305. First lid plate 405 may by characterized by a first surface 407 and a second surface 409 opposite the first surface. First surface 407 of the first lid plate 405 may contact chamber body 305, and may define companion grooves to cooperate with grooves 308 discussed above to produce a gasket channel between the components. First lid plate 405 may also define apertures 410, which may provide separation of overlying regions of the transfer chamber to form processing regions for substrate processing.

Apertures 410 may be defined through first lid plate 405, and may be at least partially aligned with substrate supports in the transfer region. In some embodiments, a number of apertures 410 may equal a number of substrate supports in the transfer region, and each aperture 410 may be axially aligned with a substrate support of the plurality of substrate supports. As will be described further below, the processing regions may be at least partially defined by the substrate supports when vertically raised to a second position within the chamber systems. The substrate supports may extend through the apertures 410 of the first lid plate 405. Accordingly, in some embodiments apertures 410 of the first lid plate 405 may be characterized by a diameter greater than a diameter of an associated substrate support. Depending on an amount of clearance, the diameter may be less than or about 25% greater than a diameter of a substrate support, and in some embodiments may be less than or about 20% greater, less than or about 15% greater, less than or about 10% greater, less than or about 9% greater, less than or about 8% greater, less than or about 7% greater, less than or about 6% greater, less than or about 5% greater, less than or about 4% greater, less than or about 3% greater, less than or about 2% greater, less than or about 1% greater than a diameter of a substrate support, or less, which may provide a minimum gap distance between the substrate support and the apertures 410.

First lid plate 405 may also include a second surface 409 opposite first surface 407. Second surface 409 may define a recessed ledge 415, which may produce an annular recessed shelf through the second surface 409 of first lid plate 405. Recessed ledges 415 may be defined about each aperture of the plurality of apertures 410 in some embodiments. The recessed shelf may provide support for lid stack components as will be described further below. Additionally, first lid plate 405 may define second apertures 420, which may at least partially define pumping channels from overlying components described below. Second apertures 420 may be axially aligned with apertures 315 of the chamber body 305 described previously.

Figure 5:
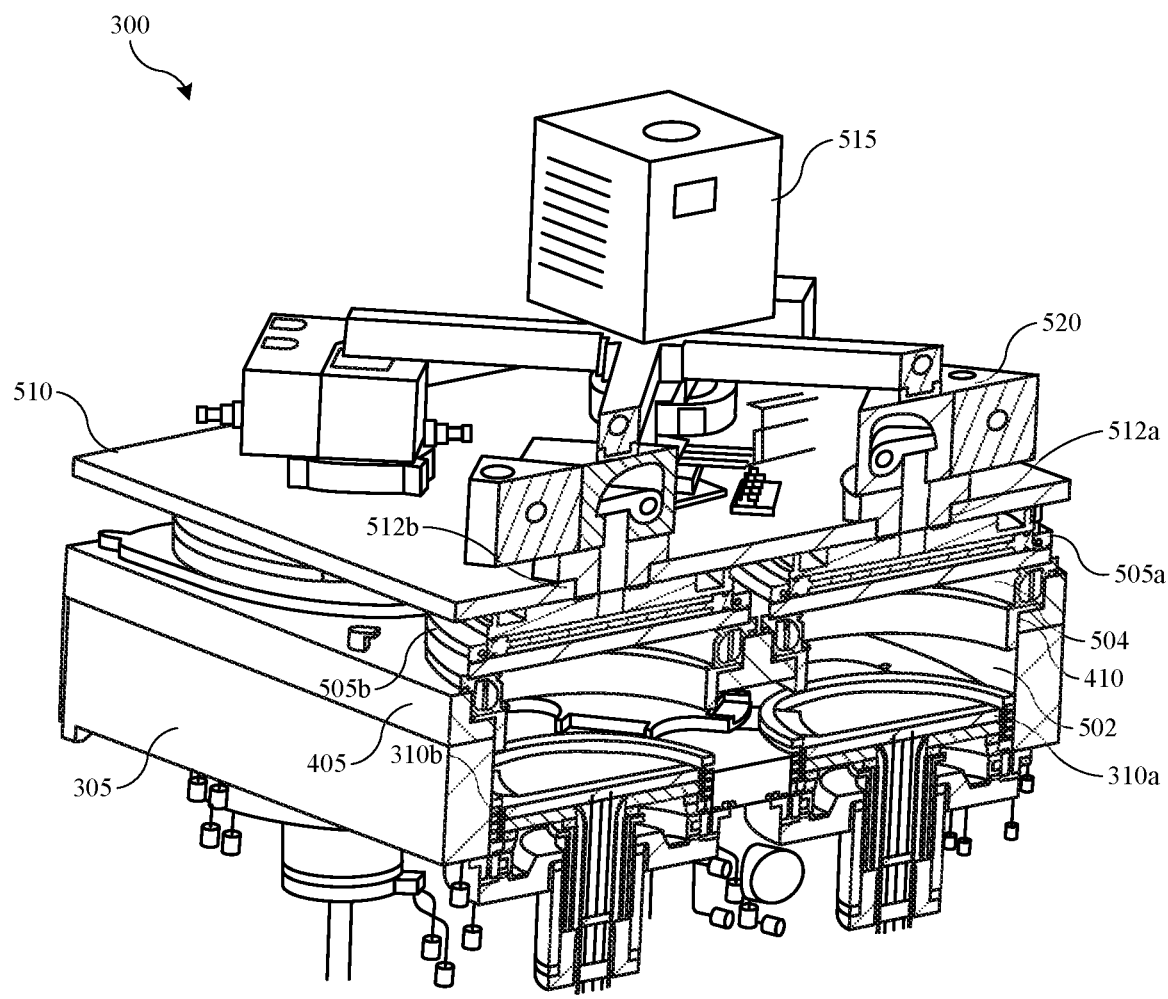
FIG. 5 shows a schematic partial isometric view of a chamber system according to some embodiments of the present technology.

FIG. 5 shows a schematic partial isometric view of chamber system 300 according to some embodiments of the present technology. The figure may illustrate a partial cross-section through two processing regions and a portion of a transfer region of the chamber system. For example, chamber system 300 may be a quad section of processing system 100 described previously, and may include any of the components of any of the previously described components or systems.

Chamber system 300, as developed through the figure, may include a chamber body 305 defining a transfer region 502 including substrate supports 310, which may extend into the chamber body 305 and be vertically translatable as previously described. First lid plate 405 may be seated overlying the chamber body 305, and may define apertures 410 producing access for processing region 504 to be formed with additional chamber system components. Seated about or at least partially within each aperture may be a lid stack 505, and chamber system 300 may include a plurality of lid stacks 505, including a number of lid stacks equal to a number of apertures 410 of the plurality of apertures. Each lid stack 505 may be seated on the first lid plate 405, and may be seated on a shelf produced by recessed ledges through the second surface of the first lid plate. The lid stacks 505 may at least partially define processing regions 504 of the chamber system 300.

As illustrated, processing regions 504 may be vertically offset from the transfer region 502, but may be fluidly coupled with the transfer region. Additionally, the processing regions may be separated from the other processing regions. Although the processing regions may be fluidly coupled with other processing regions through the transfer region from below, the processing regions may be fluidly isolated, from above, from each of the other processing regions. Each lid stack 505 may also be aligned with a substrate support in some embodiments. For example, as illustrated, lid stack 505a may be aligned over substrate support 310a, and lid stack 505b may be aligned over substrate support 310b. When raised to operational positions, such as a second position, the substrates may deliver substrates for individual processing within the separate processing regions. When in this position, as will be described further below, each processing region 504 may be at least partially defined from below by an associated substrate support in the second position.

FIG. 5 also illustrates embodiments in which a second lid plate 510 may be included for the chamber system. Second lid plate 510 may be coupled with each of the lid stacks, which may be positioned between the first lid plate 405 and the second lid plate 510 in some embodiments. As will be explained below, the second lid plate 510 may facilitate accessing components of the lid stacks 505. Second lid plate 510 may define a plurality of apertures 512 through the second lid plate. Each aperture of the plurality of apertures may be defined to provide fluid access to a specific lid stack 505 or processing region 504. A remote plasma unit 515 may optionally be included in chamber system 300 in some embodiments, and may be supported on second lid plate 510. In some embodiments, remote plasma unit 515 may be fluidly coupled with each aperture 512 of the plurality of apertures through second lid plate 510. Isolation valves 520 may be included along each fluid line to provide fluid control to each individual processing region 504. For example, as illustrated, aperture 512a may provide fluid access to lid stack 505a. Aperture 512a may also be axially aligned with any of the lid stack components, as well as with substrate support 310a in some embodiments, which may produce an axial alignment for each of the components associated with individual processing regions, such as along a central axis through the substrate support or any of the components associated with a particular processing region 504. Similarly, aperture 512b may provide fluid access to lid stack 505b, and may be aligned, including axially aligned with components of the lid stack as well as substrate support 310b in some embodiments.

Figure 6:
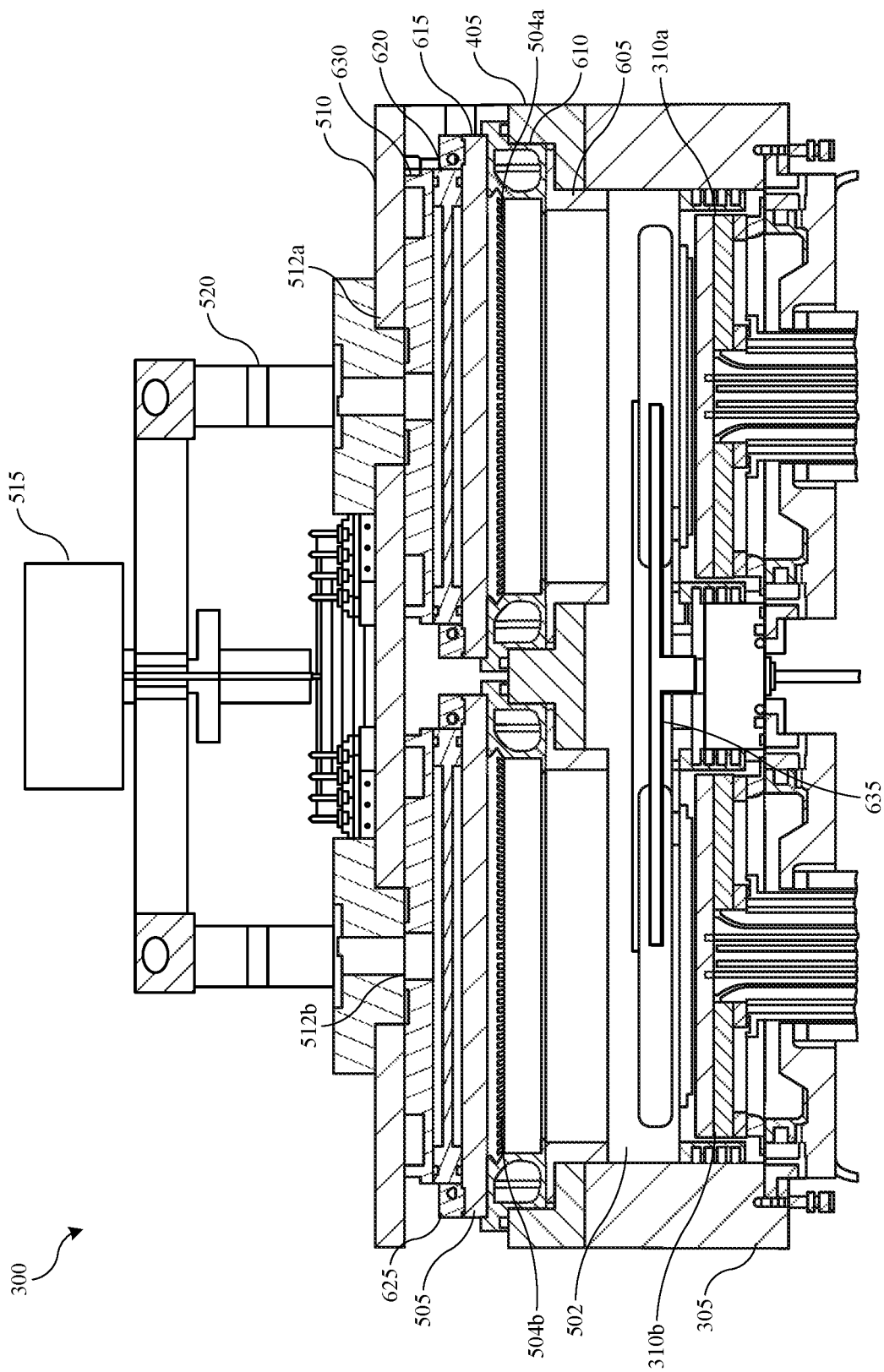
FIG. 6 shows a schematic partial cross-sectional view of an exemplary chamber system according to some embodiments of the present technology.

FIG. 6 shows a schematic cross-sectional elevation view of one embodiment of chamber system 300 according to some embodiments of the present technology. FIG. 6 may illustrate the cross-sectional view shown above in FIG. 5, and may further illustrate components of the system. The figure may include components of any of the systems illustrated and described previously, and may also show further aspects of any of the previously described systems. It is to be understood that the illustration may also show exemplary components as would be seen through any two adjacent processing regions 108 in any quad section 109 described above. The elevation view may illustrate the configuration or fluid coupling of one or more processing regions 504 with a transfer region 502. For example, a continuous transfer region 502 may be defined by chamber body 305. The housing may define an open interior volume in which a number of substrate supports 310 may be disposed. For example, as illustrated in FIG. 1, exemplary processing systems may include four or more, including a plurality of substrate supports 310 distributed within the chamber body about the transfer region. The substrate supports may be pedestals as illustrated, although a number of other configurations may also be used. In some embodiments the pedestals may be vertically translatable between the transfer region 502 and the processing regions 504 overlying the transfer region. The substrate supports may be vertically translatable along a central axis of the substrate support along a path between a first position and a second position within the chamber system. Accordingly, in some embodiments each substrate support 310 may be axially aligned with an overlying processing region 504 defined by one or more chamber components.

The open transfer region may afford the ability of a transfer apparatus 635, such as a carousel, to engage and move substrates, such as rotationally, between the various substrate supports. The transfer apparatus 635 may be rotatable about a central axis. This may allow substrates to be positioned for processing within any of the processing regions 504 within the processing system. The transfer apparatus 635 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 635 and deliver the substrates into the processing regions 504, which may be vertically offset from the transfer region 502. For example, and as illustrated, substrate support 310a may deliver a substrate into processing region 504a, while substrate support 310b may deliver a substrate into processing region 504b. This may occur with the other two substrate supports and processing regions, as well as with additional substrate supports and processing regions in embodiments for which additional processing regions are included. In this configuration, the substrate supports may at least partially define a processing region 504 from below when operationally engaged for processing substrates, such as in the second position, and the processing regions may be axially aligned with an associated substrate support. The processing regions may be defined from above by the components of the lid stacks 505, which may each include one or more of the illustrated components. In some embodiments, each processing region may have individual lid stack components, although in some embodiments components may accommodate multiple processing regions 504. Based on this configuration, in some embodiments each processing region 504 may be fluidly coupled with the transfer region, while being fluidly isolated from above from each other processing region within the chamber system or quad section.

The lid stack 505 may include a number of components, which may facilitate flow of precursors through the chamber system, and may be at least partially contained between the first lid plate 405 and the second lid plate 510. A liner 605 may be seated directly on the shelf formed by each recessed ledge in first lid plate 405. For example, liner 605 may define a lip or flange, which may allow liner 605 to extend from the shelf of first lid plate 405. Liner 605 may extend vertically below the first surface of first lid plate 405 in some embodiments, and may at least partially extend into the open transfer region 502. The liner 605 may be made of materials similar or different from the chamber body materials, and may be or include materials that limit deposition or retention of materials on the surface of liner 605. Liner 605 may define an access diameter for substrate support 310, and may be characterized by any of the gap amounts described above for clearance between the substrate support 310 and the liner 605 when included.

Seated on the liner 605 may be a pumping liner 610, which may at least partially extend within the recess or along the recessed ledge defined in the second surface of first lid plate 405. In some embodiments, pumping liner 610 may be seated on liner 605 on the shelf formed by the recessed ledge. Pumping liner 610 may be an annular component, and may at least partially define the processing region 504 radially, or laterally depending on the volume geometry. The pumping liner may define an exhaust plenum within the liner, which may define a plurality of apertures on an inner annular surface of the pumping liner providing access to the exhaust plenum. The exhaust plenum may at least partially extend vertically above a height of the first lid plate 405, which may facilitate delivering exhausted materials through an exhaust channel formed through the first lid plate and chamber body as previously described. A portion of the pumping liner may at least partially extend across the second surface of the first lid plate 405 to complete the exhaust channel between the exhaust plenum of the pumping liner, and the channel formed through the chamber body and first lid plate.

A faceplate 615 may be seated on the pumping liner 610, and may define a plurality of apertures through the faceplate 615 for delivering precursors into the processing region 504. Faceplate 615 may at least partially define an associated processing region 504 from above, which may at least partially cooperate with the pumping liner and substrate support in a raised position to generally define the processing region. Faceplate 615 may operate as an electrode of the system for producing a local plasma within the processing region 504, and thus in some embodiments, faceplate 615 may be coupled with an electrical source or may be grounded. In some embodiments the substrate support 310 may operate as the companion electrode for generating a capacitively-coupled plasma between the faceplate and the substrate support.

A blocker plate 620 may be seated on the faceplate 615, which may further distribute processing fluids or precursors to produce a more uniform flow distribution to a substrate. Blocker plate 620 may also define a number of apertures through the plate. In some embodiments the blocker plate 620 may be characterized by a diameter less than a diameter of the faceplate as illustrated, which may provide an annular access on the surface of the faceplate radially outward from the blocker plate 620. In some embodiments a faceplate heater 625 may be seated on the annular access, and may contact faceplate 615 to heat the component during processing or other operations. In some embodiments, blocker plate 620 and faceplate heater 625 may be characterized together as having an outer radial diameter equal to or substantially equal to an outer radial diameter of faceplate 615. Similarly, faceplate heater 625 may be characterized as having an outer radial diameter equal to or substantially equal to an outer radial diameter of faceplate 615 in some embodiments. Faceplate heater 625 may extend about blocker plate 620, and may or may not directly contact blocker plate 620 on an outer radial edge of the blocker plate 620.

A gas box 630 may be positioned above the blocker plate 620, and the gas box 630 of each of the lid stacks 505 may at least partially support the second lid plate 510. Gas box 630 may define a central aperture that is aligned with an associated aperture 512 of the plurality of apertures defined through second lid plate 510. Second lid plate 510 may support a remote plasma unit 515 in some embodiments, which may include piping to each of the apertures 512, and into each processing region 504. Adapters may be positioned through apertures 512 to couple the remote plasma unit piping to the gas boxes 630. Additionally, isolation valves 520 may be positioned within the piping to meter flow to each individual processing region 504 in some embodiments.

O-rings or gaskets may be seated between each component of the lid stack 505, which may facilitate vacuum processing within chamber system 300 in some embodiments. The specific component coupling between the first lid plate 405 and the second lid plate 510 may occur in any number of ways, which may facilitate accessing system components. For example, a first set of couplings may be incorporated between the first lid plate 405 and the second lid plate 510, which may facilitate removal of both lid plates and each lid stack 505, which may provide access to the substrate supports or transfer apparatus within the transfer region of the chamber system. These couplings may include any number of physical and removable couplings extending between the two lid plates, which may allow them to be separated from the chamber body 405 as a whole. For example, a drive motor on a mainframe containing the chamber system 300 may be removably coupled with the second lid plate 510, which may lift the components away from the chamber body 305.

When the couplings between the first lid plate 405 and second lid plate 510 are disengaged, second lid plate 510 may be removed while first lid plate 405 may remain on chamber body 305, which may facilitate access to one or more components of the lid stacks 505. The break within the lid stack 505 may occur between any two components described previously, some of which may be coupled with first lid plate 405, and some of which may be coupled with second lid plate 510. For example, in some embodiments each of the gas boxes 630 may be coupled with second lid plate 510. Thus, when the second lid plate is lifted from the chamber system, the gas boxes may be removed, providing access to the blocker plate and faceplate. Continuing this example, the blocker plate 620 and faceplate 615 may or may not be coupled with the first lid plate 405. For example, although mechanical coupling may be included, the components may be decoupled and sit floating on the first lid plate 405, such as with locating features maintaining proper alignment of the components. It is to be understood that the example is intended to be non-limiting, and illustrative of any number of break configurations between any two components of the lid stack when the second lid plate 510 is separated from the first lid plate 405. Consequently, depending on the coupling between the first lid plate and second lid plate, the entire lid stack and both lid plates may be removed providing access to the transfer region, or the second lid plate may be removed providing access to the lid stack components.

Figure 7A:
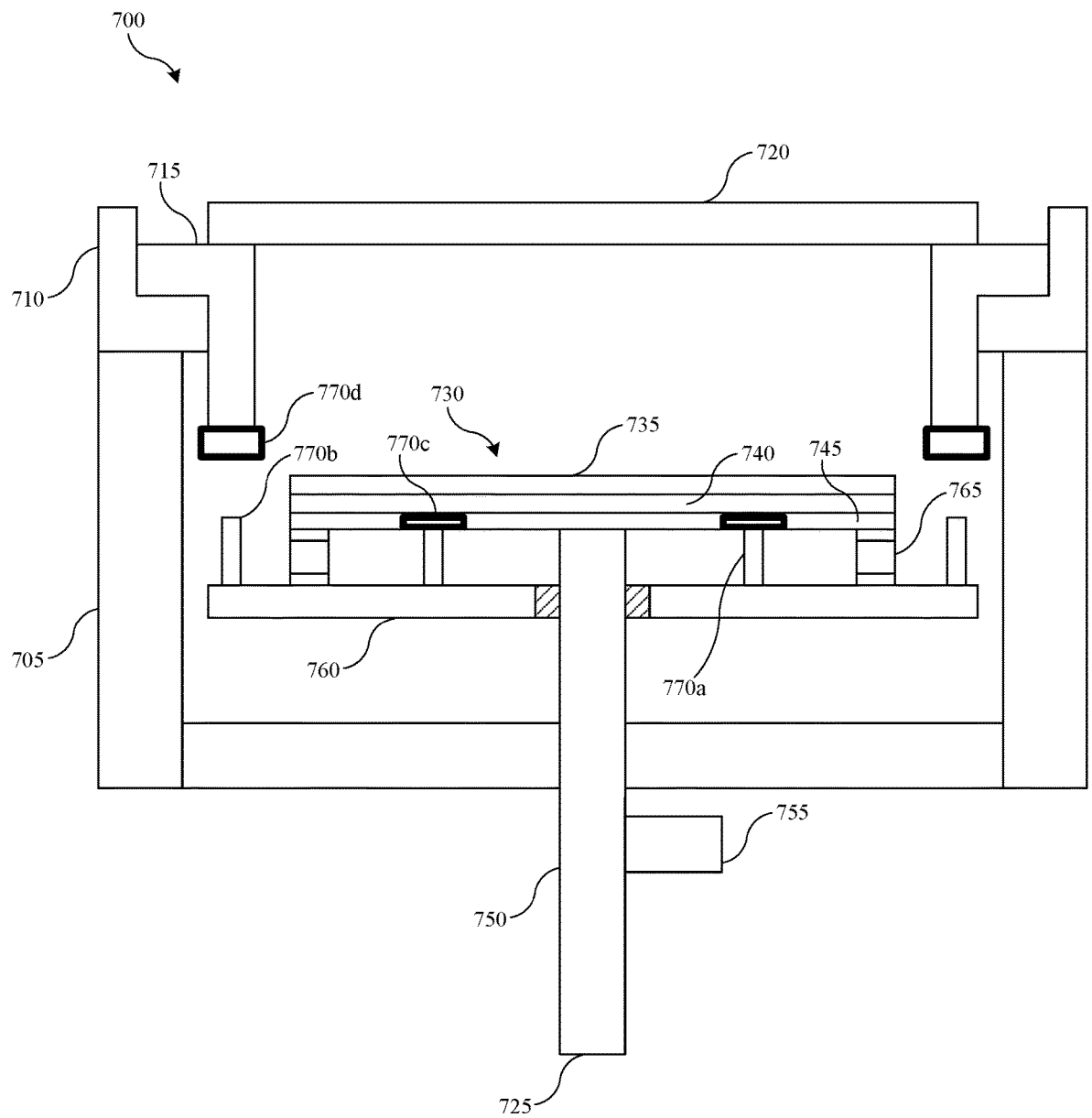
FIGS. 7A-7B show schematic partial cross-sectional views of an exemplary chamber system according to some embodiments of the present technology.
Figure 7B:
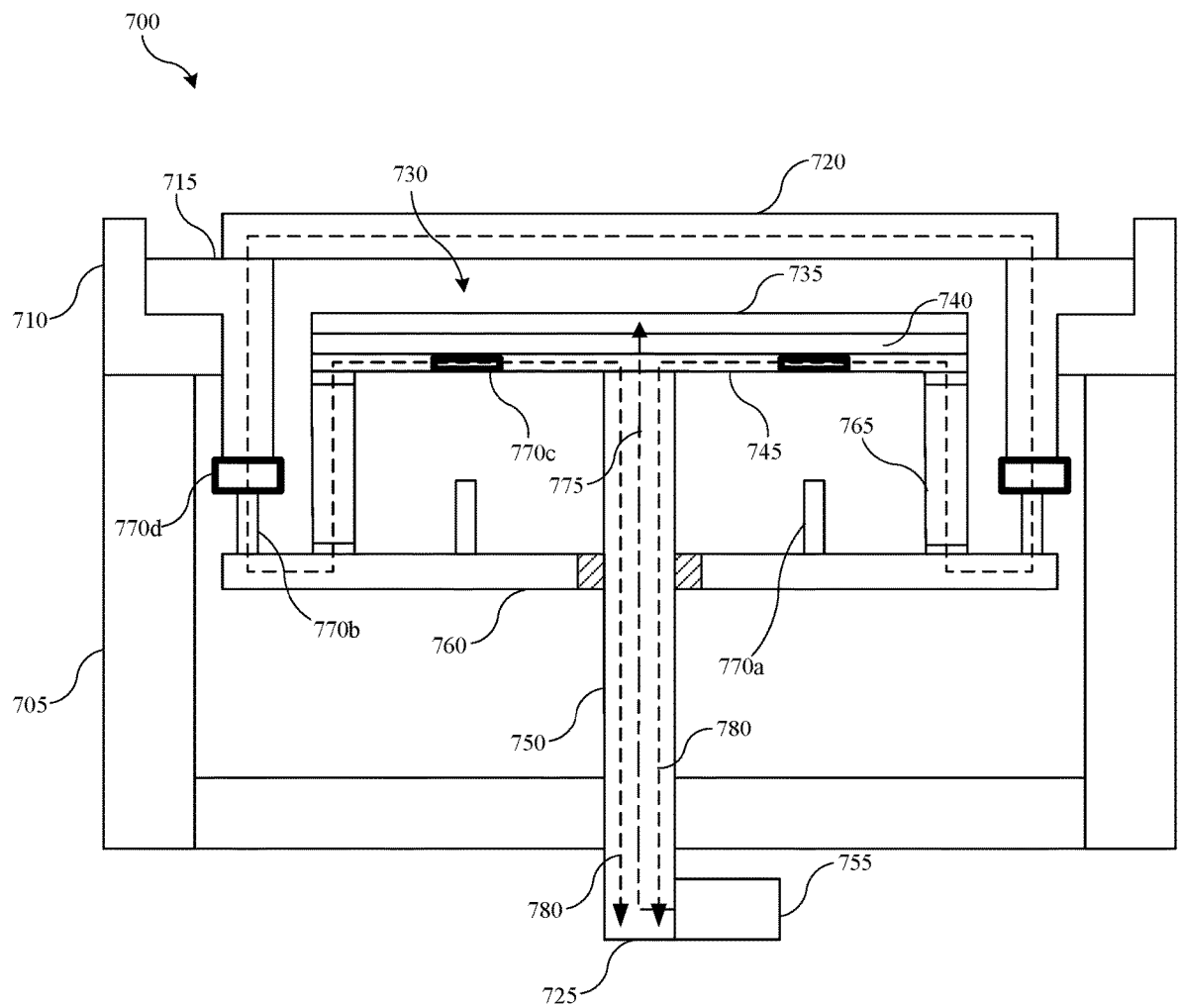

FIGS. 7A and 7B show schematic cross-sectional side elevation views of an exemplary processing chamber system 700 according to some embodiments of the present technology. FIGS. 7A and 7B may illustrate further details relating to components in systems 100, 200, and 300. System 700 is understood to include any feature or aspect of systems 100, 200, and/or 300 discussed previously in some embodiments. The system 700 may be used to perform semiconductor processing operations, such as deposition, removal, and cleaning operations. System 700 may show a partial view of the chamber components being discussed and that may be incorporated in a semiconductor processing system. Any aspect of system 700 may also be incorporated with other processing chambers or systems as will be readily understood by the skilled artisan.

System 700 may include a chamber body 705 that may define a transfer region and a processing region. A lid plate 710 may be seated atop the chamber body 705 and may support a liner 715. For example, edges of the liner 715 may be seated directly on a shelf formed by a recessed ledge of lid plate 710. For example, liner 715 may define a lip or flange, which may allow liner 715 to extend from the shelf of lid plate 710. Liner 715 may extend vertically below the first lid plate 710 in some embodiments, and may at least partially extend into an interior of the chamber body 705. A faceplate 720 may be disposed atop the liner 715. In some embodiments, one or more intervening components, such as a pump liner, may be disposed between the faceplate 720 and the liner 715.

A substrate support 725 may be disposed within the interior of the chamber body 705. The substrate support 725 may be vertically translatable within the chamber body 705 between the transfer region and the processing region. The substrate support 725 may include a support plate 730, which may include a heater 735, an isolator 740, and a ground plate 745. The substrate support 725 may also include a shaft 750 that may extend through a bottom of the chamber body 705 and couple with a radio frequency source 755. The substrate support may also include a dynamic plate 760 that is disposed about the shaft 750 and is vertically spaced from a bottom of the support plate 730. In some embodiments, a gap may be maintained between the shaft 750 and an inner edge of the dynamic plate 760, which may allow for purge gases to be supplied to the processing region from a purge gas source positioned below the chamber body 705. The dynamic plate 760 may be annular in shape and may have a greater radius than the support plate 730 such that a peripheral edge of the dynamic plate 760 extends radially outward from a peripheral edge of the support plate 730. In some embodiments, the dynamic plate 760 and/or heater 735 may be formed of a material that is resistant to a precursor, such as nitrogen trifluoride. For example, the dynamic plate 760 and/or heater 735 may be formed from an aluminum material, such as aluminum nitride. A number of straps 765 may extend between and couple a top surface of the dynamic plate 760 and a bottom surface of the support plate 730. For example, the straps 765 may be coupled with a bottom surface of the ground plate 745. The straps 765 may provide radio frequency continuity between the support plate 725 and the dynamic plate 760. Each strap 765 may be formed from a thin, flexible sheet of metal or other conductive material that allows the strap 765 to repeatedly flex between a compressed or folded state and an extended state. For example, each strap 765 may be formed from stainless steel, aluminum, and/or other metallic material. In some embodiments, the straps 765 may be coated with a precursor-resistant material. For example, the straps 765 may be coated with an aluminum material, such as aluminum nitride.

As described above, the substrate support 725 is translatable within the chamber body 705 between the a lower transfer region and an upper processing region. During a processing operation, the substrate support 725 is moved into a process position within the processing region. A radio frequency current may be flowed to the heater to help maintain a substrate at a desired temperature to aid in generating uniform film deposition on the substrate. Once deposition and/or other processing operations are complete, the substrate support 725 may be lowered to a transfer position within the transfer region. The processed substrate may be removed from the substrate support 725 and a new substrate may be positioned atop the substrate support 725. During a transfer process, no radio frequency current is supplied to the heater 735.

Features of chamber system 700 may create a closed radio frequency circuit that enables radio frequency current to flow from the radio frequency source 755 to the heater 735 and return to the radio frequency source 755 to the heater 735 when the substrate support 725 is in the process position, while opening the circuit and preventing radio frequency current to flow when the substrate support 725 is in the transfer position. For example, a number of quick disconnect members 770 may be used to couple the liner 715 with the dynamic plate 760 only when the substrate support 725 is in the process position, and may be used couple the support plate 725 with the dynamic plate 760 only when the substrate support 725 is in the transfer position. The dynamic plate 760 may include two sets of quick disconnect members 770. For example, a number of inner quick disconnect members 770a may be positioned on a top surface of the dynamic plate 760 directly beneath a portion of the support plate 730, while a number of outer quick disconnect members 770b may be positioned on the dynamic plate 760 radially outward from the outer periphery of the support plate 725 and in vertical alignment with at least a portion of the liner 715.

A number of quick disconnect members 770c may be provided on a bottom surface of the support plate 725. For example, the quick disconnect members 770c may be formed in and/or coupled with the ground plate 745. Each of the quick disconnect members 770c may be vertically aligned with a respective one of the inner quick disconnect members 770a. This enables the quick disconnect members 770c to engage with the inner quick disconnect members 770a when the substrate support 725 is in the transfer position. A number of quick disconnect members 770d may be provided on a bottom surface of the liner 715, with each of the quick disconnect members 770d being vertically aligned with a respective one of the outer quick disconnect members 770b. This enables the quick disconnect members 770d to engage with the outer quick disconnect members 770b when the substrate support 725 is in a process position.

The quick disconnect members 770 may be arranged about the various chamber components in any manner, including symmetrical and asymmetrical patterns. For example, the quick disconnect members 770 may be disposed in a symmetrical annular arrangement about each of the liner 715, support plate 725, and/or dynamic plate 760. Any number of quick disconnect members 770 may be provided. For example, each of quick disconnect members 770a, 770b, 770c, and/or 770d may include about or greater than 2 quick disconnect members, about or greater than 3 quick disconnect members, about or greater than 4 quick disconnect members, about or greater than 5 quick disconnect members, about or greater than 6 quick disconnect members, about or greater than 7 quick disconnect members, about or greater than 8 quick disconnect members, about or greater than 9 quick disconnect members, about or greater than 10 quick disconnect members, about or greater than 12 quick disconnect members, about or greater than 14 quick disconnect members, about or greater than 16 quick disconnect members, about or greater than 18 quick disconnect members, about or greater than 20 quick disconnect members, or more. It will be appreciated that in some embodiments, each group of quick disconnect members 770a, 770b, 770c, and 770d may have the same number of quick disconnect members, while in other embodiments at least one group of quick disconnect members 770a, 770b, 770c, and 770d has a different number of quick disconnect members than at least one other group.

In some embodiments, each quick disconnect member 770 may include male and/or female portions that engage with corresponding portions of another quick disconnect member 770. For example, the inner quick disconnect members 770a and/or outer quick disconnect members 770b may have male portions, such as guide pins, while the quick disconnect members 770c and 770d may include female portions, such as receptacles that receive and secure the male portions of corresponding inner quick disconnect members 770a and/or outer quick disconnect members 770b. In some embodiments, the receptacle may include additional coupling mechanisms. For example, each receptacle may include a spring-loaded ball catch that engages with a notch on one of the guide pins to secure the guide pin within the receptacle. It will be appreciated that in various embodiments, the positions of male and female portions may be reversed, with inner quick disconnect members 770a and/or outer quick disconnect members 770b having female portions, while the quick disconnect members 770c and 770d have male portions. In some embodiments, a particular group of quick disconnect members 770a, 770b, 770c, and/or 770d may include both male and female portions. In embodiments in which the outer quick disconnect members 770b include male guide pins, a top surface of each guide pin may be no higher than a top surface of the support plate 725. This ensures that during transfer of substrates, the pins do not interfere with removal and placement of substrates on the support plate 725.

FIG. 7A illustrates the substrate support 725 in the transfer position, with the support plate 730 being proximate a bottom of the chamber body 705. In the transfer position, the inner quick disconnect members 770a and the quick disconnect members 770c on the support plate 725 are engaged with one another, and straps 765 are in a compressed state. The outer quick disconnect members 770b are disengaged and spaced apart from the quick disconnect members 770d on the liner 715, thereby opening a radio frequency circuit to prevent radio frequency current flow through the heater 735 when in the transfer position.

The substrate support 725 may be raised upward into the processing region with the support plate 730 being proximate to the faceplate 720 when in the process position, as shown in FIG. 7B. As the substrate support 725 is raised, the engagement between the inner quick disconnect members 770a and the quick disconnect members 770c pulls the dynamic plate 760 upward with the substrate support 725 until the outer quick disconnect members 770b contact and engage with the quick disconnect members 770d of the liner 715. The engagement of the outer quick disconnect members 770b and the quick disconnect members 770d provides radio frequency continuity between the liner 715 and the dynamic plate 760, as well as serves as a hard stop that prevents the dynamic plate 760 from moving further upward. As the substrate support 725 moves further upward to the process position, the inner quick disconnect members 770a and quick disconnect members 770c are pulled out of engagement with one another, while the straps 765 maintain radio frequency continuity between the dynamic plate 760 and the support plate 725. In this process position, a closed radio frequency circuit is provided that allows radio frequency current to flow from the radio frequency source 755 to the heater 735 as shown by arrow 775 and enables return current to flow back to the radio frequency source 755 as shown by arrows 780. For example, the closed radio frequency circuit may be formed by the radio frequency source 755, substrate support 725 (including the dynamic plate 760, support plate 730, shaft 750, and straps 765), the liner 715, and the faceplate 720. It will be appreciated that the radio frequency circuit may also include other components, such as components between the liner 715 and faceplate (such as a pump liner and/or lid plate 710), as well as plasma formed between the heater 735 and the faceplate 720.

The use of quick disconnect members 770 and straps 765 to create a dynamic radio frequency interface as described herein creates a closed radio frequency circuit when the substrate support is in the process position and opens the circuit when in the transfer position. Additionally, given the small size of the quick disconnect members 770, there is less surface area between components that dynamically contact one another than in conventional designs, which reduces the generation of particles from previous processing operations and results in substrates of higher quality. Additionally, the use of quick disconnect members 770 rather than a baffle-oriented design significantly reduces the weight of the chamber and enables the components of the radio frequency circuit to be more easily serviced by a single technician.

Figure 8A:
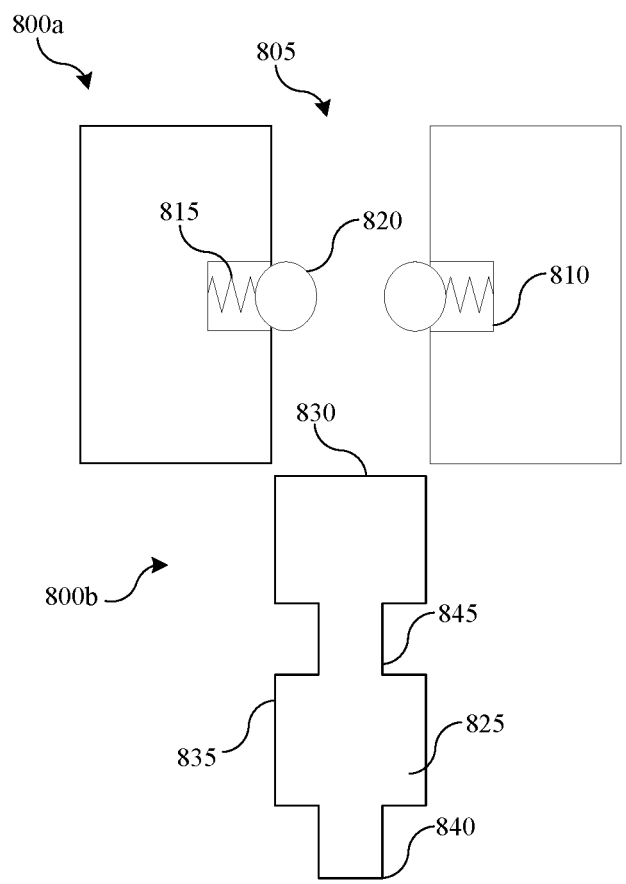
FIGS. 8A-8B show schematic partial cross-sectional views of exemplary quick disconnect members according to some embodiments of the present technology.
Figure 8B:
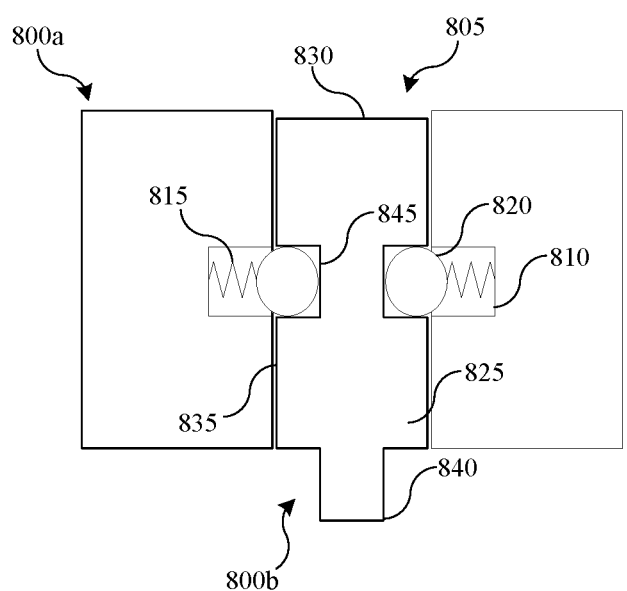

FIGS. 8A and 8B illustrate cross-sectional side elevation views of exemplary quick disconnect members 800 according to some embodiments of the present technology. Quick disconnect members 800 may be similar to quick disconnect members 770 described herein, and may be used in any of the systems described herein, including systems 100, 200, 300, and/or 700. Each quick disconnect member 800 may include a male or female portion. For example, a female quick disconnect member 800a may include a receptacle 805 that may be formed in and/or coupled with a substrate (such as a liner, support plate, and/or dynamic plate). Each receptacle may include one or more retention members. For example, an interior of each receptacle 805 may include one or more detents 810. Each detent 810 may be coupled with one end of a spring 815, while the other end of the spring is coupled with a ball 820 or other object. Such a configuration provides a spring-loaded ball catch within each receptacle 805 that receives and secures a corresponding male quick disconnect member 800b. For example, each male quick disconnect member 800b is in the form of a guide pin 825. Guide pin 825 may include an elongate body having a distal end 830, a medial portion 835, and a proximal end 840. Proximal end 840 may be coupled with and formed as part of a substrate (such as a liner, support plate, and/or dynamic plate). The medial portion 835 may define a notch 845 that is sized to receive a portion of the ball 820. To engage the quick disconnect members 800, the distal end 830 of the guide pin 825 may be inserted into the receptacle 805. The distal end 830 may force the spring-loaded ball 820 into the detent 810 until the notch 845 is aligned with the ball 820 as shown in FIG. 8B. The spring force may press the ball 820 into the detent 810 to secure the guide pin 825 within the receptacle 805. This process may be reversed to remove the guide pin 825 from the receptacle 805, with a predetermined amount of force being required to pull the distal end 830 past the spring-loaded ball 820.

Figure 9:
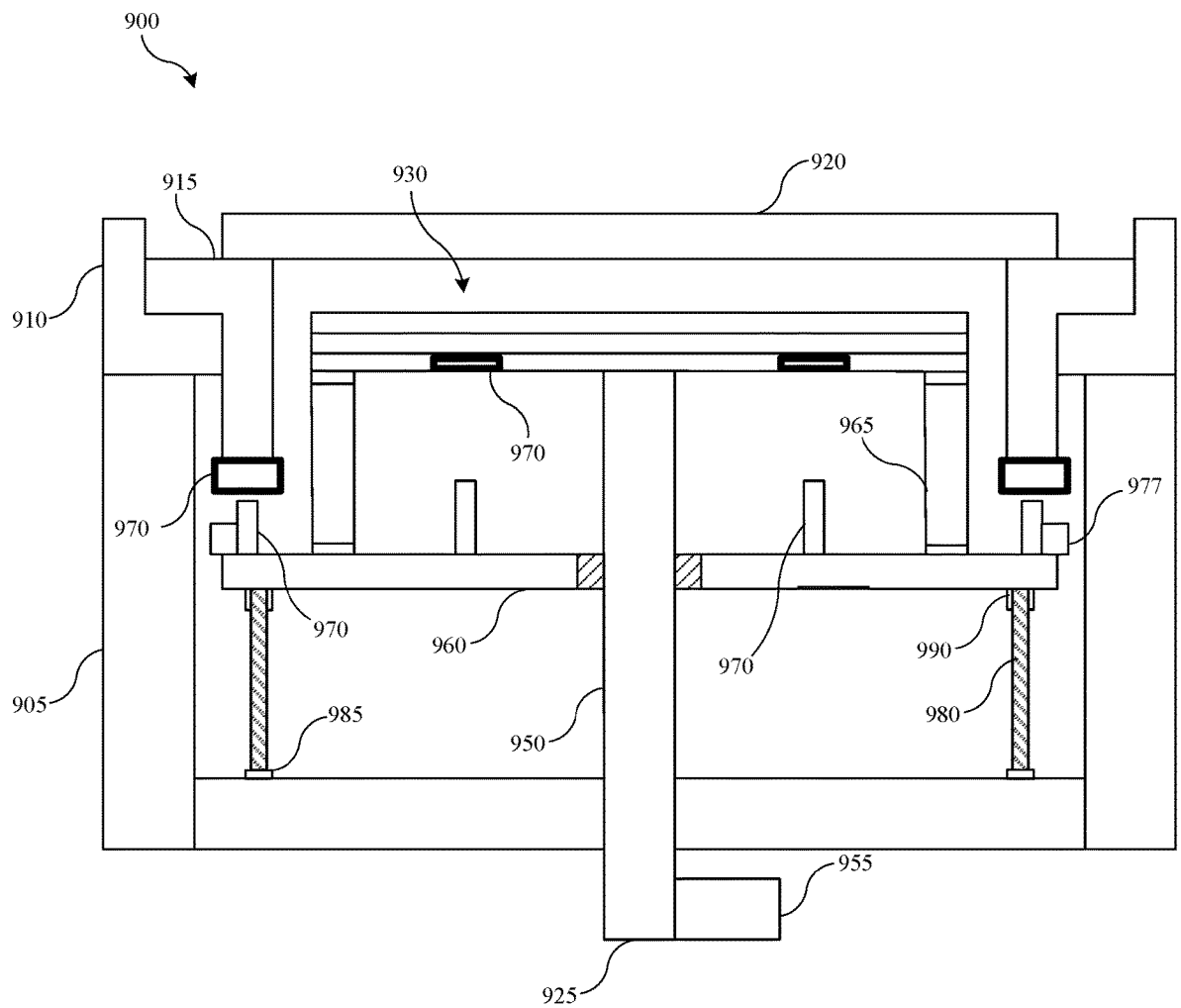
FIG. 9 shows a schematic partial cross-sectional views of an exemplary chamber system according to some embodiments of the present technology.

FIG. 9 shows a schematic cross-sectional side elevation views of an exemplary processing chamber system 900 according to some embodiments of the present technology. FIG. 9 may illustrate further details relating to components in systems 100, 200, 300, and 700. System 900 is understood to include any feature or aspect of systems 100, 200, 300, and/or 700 discussed previously in some embodiments. The system 900 may be used to perform semiconductor processing operations, such as deposition, removal, and cleaning operations. System 900 may show a partial view of the chamber components being discussed and that may be incorporated in a semiconductor processing system. Any aspect of system 900 may also be incorporated with other processing chambers or systems as will be readily understood by the skilled artisan.

System 900 may include a chamber body 905 that may define a transfer region and a processing region. A lid plate 910 may be seated atop the chamber body 905 and may support a liner 915. A faceplate 920 may be disposed atop the liner 915. In some embodiments, one or more intervening components, such as a pump liner, may be disposed between the faceplate 920 and the liner 915. A substrate support 925 may be disposed within the interior of the chamber body 905 and may include a support plate 930. The substrate support 925 may be vertically translatable within the chamber body 905 between the transfer region and the processing region and may include a shaft 950 that may extend through a bottom of the chamber body 905 and couple with a radio frequency source 955. The substrate support may also include a dynamic plate 960 that is disposed about the shaft 950 and is vertically spaced from a bottom of the support plate 930. The dynamic plate 960 may be annular in shape and may have a greater radius than the support plate 930 such that a peripheral edge of the dynamic plate 960 extends radially outward from a peripheral edge of the support plate 930. In some embodiments, an RF gasket 977 may be positioned atop the top surface of the peripheral edge of the dynamic plate 960. The RF gasket 977 may help provide more consistent repeatability of an RF return path by ensuring proper contact between the dynamic plate 960 and the liner 915 when the dynamic plate 960 is elevated to bring the RF gasket 977 into contact with the liner 915. A number of straps 965 may extend between and couple a top surface of the dynamic plate 960 and a bottom surface of the support plate 930. In some embodiments, in addition to or in place of the straps 965, a flexible bellow may be positioned between the support plate 925 and the dynamic plate 960 to maintain radio frequency continuity between the support plate 925 and the dynamic plate 960. For example, the bellow may be compressed when the substrate support 925 is in a transfer position and may expand when the substrate support 925 is in a process position. A number of quick disconnect members 970 may be provided that couple the support plate 930 with the dynamic plate 960 in the transfer position and/or that couple the liner 915 with the dynamic plate 960 in the process position in a manner similar to that described in relation to FIGS. 7A-7C.

System 900 may include one or more springs 980 that may be positioned between a bottom surface of the dynamic plate 960 and a top surface of the bottom of the chamber body 905. For example, each spring 980 may be positioned on a corresponding guide pin 985 that extends between the bottom surface of the dynamic plate 960 and a top surface of the bottom of the chamber body 905. In some embodiments, a top end of each spring 980 may be positioned within or under an isolator 990 that may isolate the spring 980 from RF current and ensure that the RF circuit extends back through the substrate support 925, rather than down through the spring 980. Each spring 980 may provide spring force that pushes upward against the bottom surface of the dynamic plate 960. When the substrate support 925 is being lowered and/or in the transfer position, at least some of the quick disconnect members 970 may provide downward force on the dynamic plate 960 that is greater than the spring force, which causes the dynamic plate 960 to lower and the springs 980 to further compress. As the substrate support 925 is translated upward, the springs 980 may begin to extend and push the dynamic plate 960 upwards, with at least some of the quick disconnect members 970 preventing the dynamic plate 960 from contacting the support plate 930. The springs 980 may provide sufficient force to raise the dynamic plate 960 to a height in which dynamic plate 960 and/or RF gasket 977 is in contact with a bottom surface of the liner 915 to complete an RF circuit as previously described.

Figure 10:
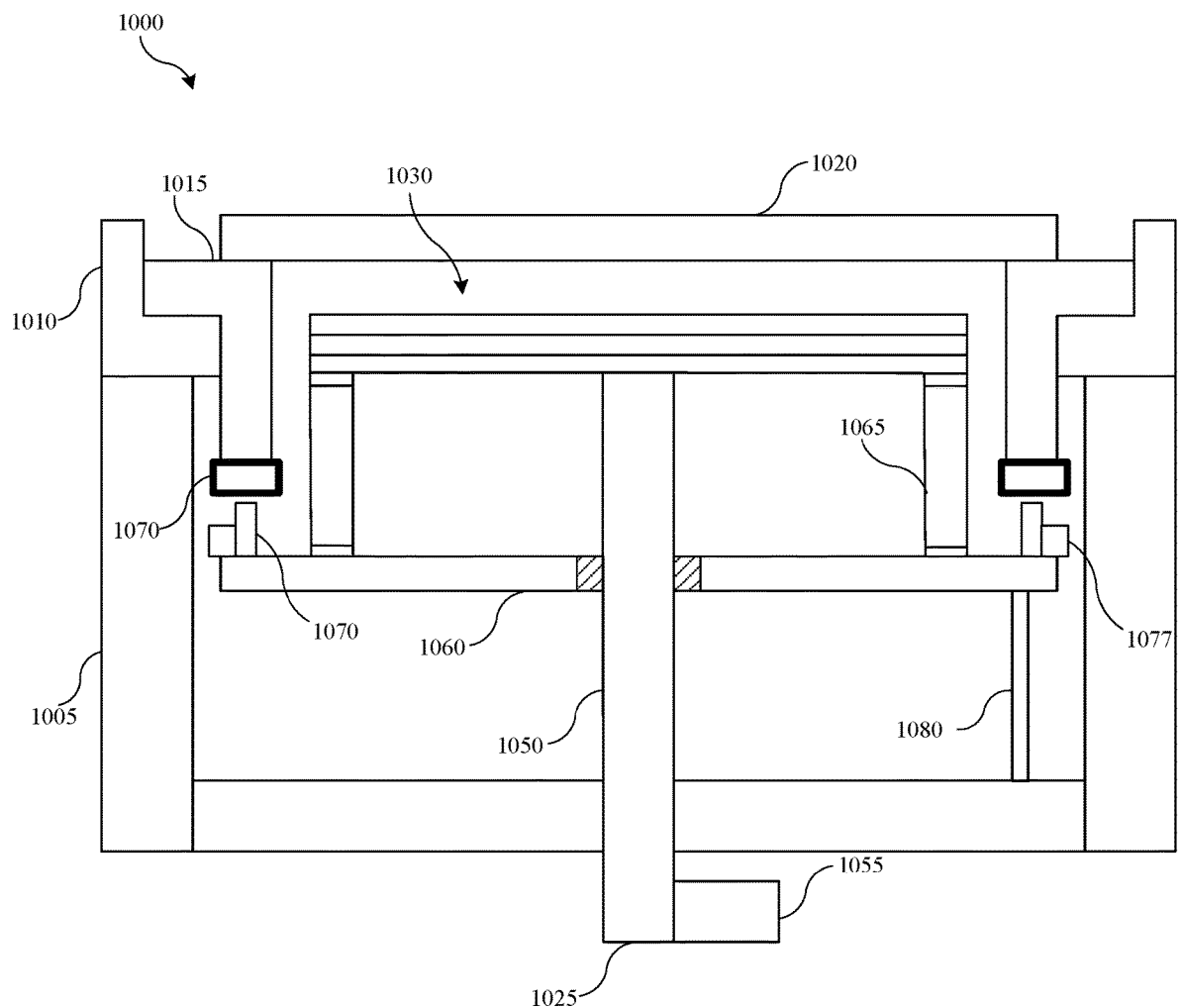
FIG. 10 shows a schematic partial cross-sectional views of an exemplary chamber system according to some embodiments of the present technology.

FIG. 10 shows a schematic cross-sectional side elevation views of an exemplary processing chamber system 1000 according to some embodiments of the present technology. FIG. 10 may illustrate further details relating to components in systems 100, 200, 300, 700, and 900. System 1000 is understood to include any feature or aspect of systems 100, 200, 300, 700, and/or 900 discussed previously in some embodiments. The system 1000 may be used to perform semiconductor processing operations, such as deposition, removal, and cleaning operations. System 1000 may show a partial view of the chamber components being discussed and that may be incorporated in a semiconductor processing system. Any aspect of system 1000 may also be incorporated with other processing chambers or systems as will be readily understood by the skilled artisan.

System 1000 may include a chamber body 1005 that may define a transfer region and a processing region. A lid plate 1010 may be seated atop the chamber body 1005 and may support a liner 1015. A faceplate 1020 may be disposed atop the liner 1015. In some embodiments, one or more intervening components, such as a pump liner, may be disposed between the faceplate 1020 and the liner 1015. A substrate support 1025 may be disposed within the interior of the chamber body 1005 and may include a support plate 1030. The substrate support 1025 may be vertically translatable within the chamber body 1005 between the transfer region and the processing region and may include a shaft 1050 that may extend through a bottom of the chamber body 1005 and couple with a radio frequency source 1055. The substrate support may also include a dynamic plate 1060 that is disposed about the shaft 1050 and is vertically spaced from a bottom of the support plate 1030. The dynamic plate 1060 may be annular in shape and may have a greater radius than the support plate 1030 such that a peripheral edge of the dynamic plate 1060 extends radially outward from a peripheral edge of the support plate 1030. In some embodiments, an RF gasket 1077 may be positioned atop the top surface of the peripheral edge 1065 of the dynamic plate 1060. The RF gasket 1077 may help provide more consistent repeatability of an RF return path by ensuring proper contact between the dynamic plate 1060 and the liner 1015 when the dynamic plate 1060 is elevated to bring the RF gasket 1077 into contact with the liner 1015. A number of straps 1065 may extend between and couple a top surface of the dynamic plate 1060 and a bottom surface of the support plate 1030. In some embodiments, in addition to or in place of the straps 1070, a flexible bellow may be positioned between the support plate 1025 and the dynamic plate 1060 to maintain radio frequency continuity between the support plate 1025 and the dynamic plate 1060. For example, the bellow may be compressed when the substrate support 1025 is in a transfer position and may expand when the substrate support 1025 is in a process position. A number of quick disconnect members 1070 may be provided that couple the liner 1015 with the dynamic plate 1060 in the process position in a manner similar to that described in relation to FIGS. 7A-7C.

System 1000 may include a linear actuator 1080, such as a pneumatic and/or electromechanical lift, that may be used to raise and lower the dynamic plate 1060 between a process position and a transfer position. For example, the linear actuator 1080 may be positioned between a bottom surface of the dynamic plate 1060 and a top surface of the bottom of the chamber body 1005. As the support plate 1030 is raised and lowered, the linear actuator 1080 may cause a corresponding movement of the dynamic plate 1060, which may enable the dynamic plate 1060 and/or RF gasket 1077 to be brought into contact with the liner 1015 when the support plate 1030 is in the process position and out of contact with the liner 1015 when the support plate 1030 is in the transfer position. In the process position, the quick disconnect members 1070 may be engaged with one another to couple the liner 1015 with the dynamic plate 1060 and close an RF circuit that allows radio frequency current to flow from the radio frequency source 1055 to the support plate 1030 and enables return current to flow back to the radio frequency source 1055.

Figure 11:
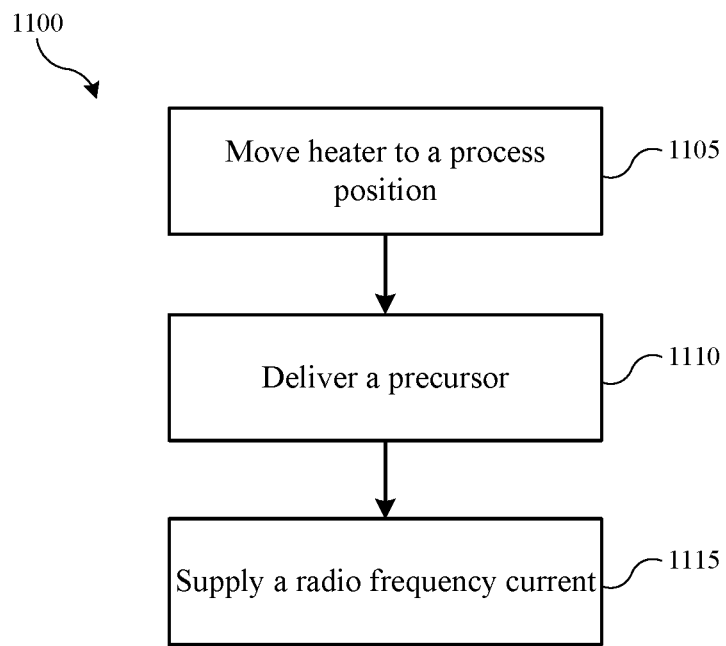
FIG. 11 shows operations of an exemplary method of processing a substrate according to some embodiments of the present technology.

FIG. 11 shows operations of an exemplary method 1100 of substrate processing according to some embodiments of the present technology. The method may be performed in a variety of processing chambers, including processing system 100, 200, 300, 700, 900, and 1000 described above, which may include dynamic radio frequency circuits according to embodiments of the present technology. Method 1100 may include a number of optional operations, which may or may not be specifically associated with some embodiments of methods according to the present technology.

Method 1100 may include a method that may include optional operations prior to initiation of method 1100, or the method may include additional operations. For example, method 1100 may include operations performed in different orders than illustrated. In some embodiments, method 1100 may include moving a substrate support having a heater upward within a semiconductor processing chamber from a transfer position to a process position to disengage a first number of quick disconnect members and to engage a second number of quick disconnect members to close a radio frequency circuit at operation 1105. For example, the first number of disconnect members may couple a support plate of the substrate support with a dynamic plate of the substrate support. As the substrate support is raised, the engagement between the first number of disconnect members pulls the dynamic plate upward with the substrate support until the second set quick disconnect members contact and engage with one another. For example, the second number of disconnect members may couple a liner of the semiconductor processing chamber with the dynamic plate. The engagement of the second number of quick disconnect members provides radio frequency continuity between the liner and the dynamic plate and closes a radio frequency circuit of the processing chamber, as well as serves as a hard stop that prevents the dynamic plate from moving further upward. As the substrate support moves further upward to the process position, the first number of quick disconnect members are pulled out of engagement with one another, while a number of straps maintain electrical continuity between the dynamic plate and the support plate.

At operation 1110, one or more precursors, such as (but not limited to) a silicon-containing precursor, may be delivered to the semiconductor processing chamber. A radio frequency current may be supplied to the faceplate, the heater, or some other component via a radio frequency source at operation 1115. For example, the radio frequency may be used to generate a capacitively-coupled plasma between the faceplate and the heater to perform a deposition operation within the processing region of the chamber. The quick disconnects engaged with the liner may produce a symmetrical ground path to operate as a radio frequency return through the pedestal. By utilizing a number of quick disconnects coupling the components within the chamber, plasma uniformity may be maintained by producing the symmetrical ground path through the dynamic plate and flexible straps, while accommodating separation of the support plate from the dynamic plate during translation of the pedestal within the system.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A substrate processing system, comprising:
a chamber body that defines a processing region;
a liner positioned atop the chamber body, wherein a bottom surface of the liner comprises a first plurality of quick disconnect members;
a faceplate that is positioned atop the liner;
a substrate support disposed within the chamber body, the substrate support comprising:
a support plate comprising a heater, wherein a bottom surface of the support plate comprises a second plurality of quick disconnect members;
a shaft that is coupled with a bottom of the support plate;
a dynamic plate disposed about the shaft and spaced a distance below the support plate; and
a plurality of metallic straps that couple a bottom of the support plate with the dynamic plate, wherein:
a top surface of the dynamic plate comprises an inner plurality of quick disconnect members and an outer plurality of quick disconnect members;
each of the inner plurality of quick disconnect members is engageable with a respective one of the second plurality of quick disconnect members when the substrate support is in a transfer position; and
each of the outer plurality of quick disconnect members is engageable with a respective one of the first plurality of quick disconnect members when the substrate support is in a process position.

2. The substrate processing system of claim 1, wherein:
each of the outer plurality of quick disconnect members is disengaged from the respective one of the first plurality of quick disconnect members when the substrate support is in the transfer position; and
each of the inner plurality of quick disconnect members is disengaged from the respective one of the second plurality of quick disconnect members when the substrate support is in the process position.

3. The substrate processing system of claim 1, wherein:
the substrate support is proximate the faceplate when in the process position; and
the substrate support is proximate a base of the chamber body when in the transfer position.

4. The substrate processing system of claim 1, wherein:
a peripheral edge of the dynamic plate extends radially beyond a peripheral edge of the support plate.

5. The substrate processing system of claim 1, wherein:
each of the outer plurality of quick disconnect members comprises a guide pin; and
each of the first plurality of quick disconnect members defines a receptacle with a spring loaded catch that is sized to receive and secure a respective one of the guide pins.

6. The substrate processing system of claim 5, wherein:
a top surface of each of the guide pins is at a lower height than a top surface of the heater.

7. The substrate processing system of claim 1, wherein:
the support plate further comprises an isolator coupled with the heater and a ground plate coupled with a bottom of the isolator; and
the second plurality of quick disconnect members are disposed on the ground plate.

8. The substrate processing system of claim 1, wherein:
each of the plurality of straps is coated with a precursor-resistant material.

9. The substrate processing system of claim 1, further comprising:
a radio frequency source coupled with the substrate support, wherein in the process position, a closed radio frequency circuit is formed between the radio frequency source, the substrate support, the plurality of straps, the liner, and the faceplate.

10. A substrate processing system, comprising:
a chamber body that defines a processing region;
a liner positioned atop the chamber body;
a faceplate that is positioned atop the liner;
a substrate support disposed within the chamber body, the substrate support comprising:
   a support plate comprising a heater;
   a shaft that is coupled with a bottom of the support plate;
   a dynamic plate disposed about the shaft and spaced a distance below the support plate; and
   a plurality of metallic straps that couple a bottom of the support plate with the dynamic plate; and
a plurality of quick disconnect members that couple the liner with the dynamic plate when the substrate support is in a process position and that couple the support plate with the dynamic plate when the substrate support is in a transfer position.

11. The substrate processing system of claim 10, wherein:
the plurality of quick disconnect members comprise:
   an outer plurality of quick disconnect members on the dynamic plate that engage with a first plurality of quick disconnect members on the liner; and
   an inner plurality of quick disconnect members on the dynamic plate that engage with a second plurality of quick disconnect members on the support plate.

12. The substrate processing system of claim 11, wherein:
each of the outer plurality of quick disconnect members is disengaged from the respective one of the first plurality of quick disconnect members when the substrate support is in the transfer position; and
each of the inner plurality of quick disconnect members is disengaged from the respective one of the second plurality of quick disconnect members when the substrate support is in the process position.

13. The substrate processing system of claim 10, wherein:
the plurality of quick disconnect members comprises a first subset of quick disconnect members and a second subset of quick disconnect members;
each of the first subset of quick disconnect members comprises a guide pin; and
each of the second subset of quick disconnect members defines a receptacle with a spring loaded catch that is sized to receive and secure a respective one of the guide pins.

14. The substrate processing system of claim 13, wherein:
a top surface of each of the guide pins is at a lower height than a top surface of the heater.

15. The substrate processing system of claim 10, wherein:
the support plate further comprises an isolator coupled with the heater and a ground plate coupled with a bottom of the isolator; and
at least some of the plurality of quick disconnect members are disposed on the ground plate.

16. The substrate processing system of claim 10, further comprising:
a radio frequency source coupled with the substrate support, wherein in the process position, a closed radio frequency circuit is formed between the radio frequency source, the substrate support, the plurality of straps, the liner, and the faceplate.

17. The substrate processing system of claim 10, wherein:
the substrate support is movable in a vertical direction between the transfer position and the process position.

* * * * *